United States Patent

Matsumoto et al.

[11] Patent Number: 5,932,116
[45] Date of Patent: Aug. 3, 1999

[54] POWER SUPPLY FOR MULTI-ELECTRODE DISCHARGE

[75] Inventors: Kazunori Matsumoto, Kosugi-machi; Toru Nakajima, Tokyo, both of Japan

[73] Assignee: Tohoku Unicom Co., Ltd., Yamagata, Japan

[21] Appl. No.: 08/952,968

[22] PCT Filed: Jun. 5, 1996

[86] PCT No.: PCT/JP96/01521

§ 371 Date: Dec. 5, 1997

§ 102(e) Date: Dec. 5, 1997

[87] PCT Pub. No.: WO96/39794

PCT Pub. Date: Dec. 12, 1996

[30] Foreign Application Priority Data

| Jun. 5, 1995 | [JP] | Japan | 7/161379 |
| Jun. 5, 1995 | [JP] | Japan | 7/161380 |
| Jun. 23, 1995 | [JP] | Japan | 7/180792 |
| Jun. 28, 1995 | [JP] | Japan | 7/184689 |

[51] Int. Cl.$^6$ .................................................. B23K 10/00
[52] U.S. Cl. ............................... 219/121.57; 219/121.36; 219/121.54; 315/147; 315/197
[58] Field of Search ......................... 219/121.43, 121.57, 219/121.36, 121.54; 315/111.21, 147, 148, 195, 197

[56] References Cited

U.S. PATENT DOCUMENTS

| 4,361,441 | 11/1982 | Tylko | 219/121.36 |
| 4,436,984 | 3/1984 | Hare et al. | 219/383 |

FOREIGN PATENT DOCUMENTS

| 0457406 | 2/1992 | Japan . |
| 6013196 | 1/1994 | Japan . |
| 7029891 | 1/1995 | Japan . |

*Primary Examiner*—Mark Paschall
*Attorney, Agent, or Firm*—Jones, Tullar & Cooper, P.C.

[57] ABSTRACT

Disclosed is a new ac electric discharging power supply which is capable of permitting electric discharge to appear without difficulty even in the atmosphere of reduced gas pressure or even though undesired dielectric material should be accidentally adhered to the electrode surface, and in which power supply the plasma parameters vary hardly with time.

The signal from master oscillator (1) is divided into a plurality of divisions by power divider (2), and each power division is controlled in phase and amplitude by phase-shifters (3) and power amplifiers (4). Oscillating frequency, phase and amplitude are controlled coordinately by control (7), and the final voltages appearing at the output terminals of power amplifiers (5) are applied to electrodes 6, which are arranged in an electric discharging vessel.

One output terminals of all power transformers (5) are connected in common, ordinarily in floating condition, thereby permitting electric discharges to appear between selected electrodes (6).

The phases and amplitudes of different voltages applied to electrodes (6) may be controlled to be same or appropriate for a particular application. Also, the shape and arrangement of electrodes (6) may be so selected as to be most appropriate for a particular application.

4 Claims, 14 Drawing Sheets

FIG. 16(a)
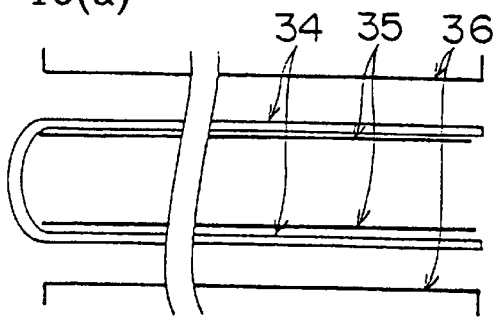
FIG. 16(b)
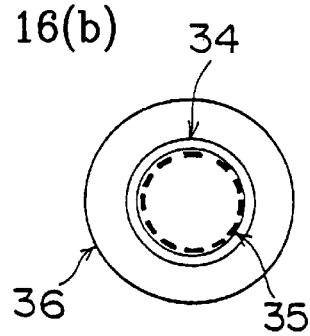
FIG. 17
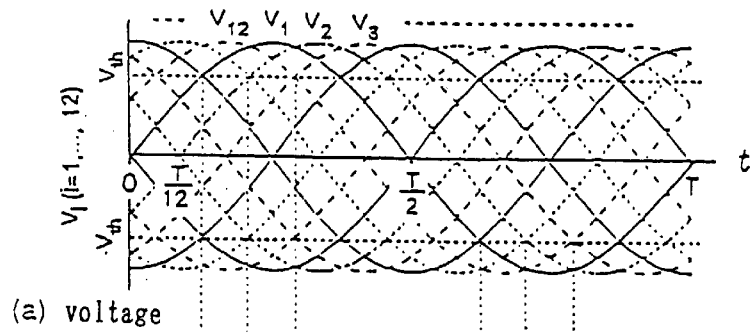
(a) voltage
FIG. 18
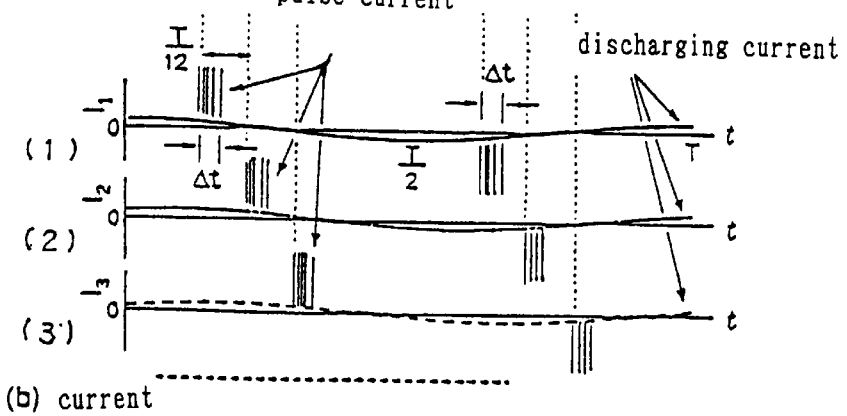
(b) current
FIG. 19
$$I_t = \sum_{i=1}^{12} I_i = \sum_{i=1}^{12} \frac{V_i}{Z} = \sum_{i=1}^{12} \frac{Ve^{j(i-1)\Delta\theta}}{|Z|e^{j\varphi}} = \frac{V}{|Z|}\varepsilon^{-j\varphi} \sum_{i=1}^{12} e^{j(i-1)\frac{2\pi}{12}} = 0$$

POWER SUPPLY FOR MULTI-ELECTRODE DISCHARGE

BACKGROUND OF THE INVENTION

1. Field of the Invention

The present invention relates to a new electric discharging power supply which is capable of permitting stable electric discharge to appear effectively in plasma discharge appliances.

2. Description of the Related Art

Generally speaking, the method of producing electric discharge includes four different electric discharges, that is, dc or ac electric discharge, high-frequency, static-electricity coupling electric discharge, high-frequency, inductive magnetic coupling electric discharge and microwave electric discharge.

The feature of each electric discharge is described below in terms of discharging condition, power supply structure and other factors.

The feature of dc electric discharge is: advantageously plasma density, plasma temperature and other plasma parameters are stable with time, and no load matching is required. Accordingly the structure of power supply can be simplified. Disadvantageously accidental adhesion of undesired dielectric substance to the electrode surface causes disappearance of electric discharge. Electric discharge cannot appear easily at a relatively low gas pressure.

The feature of ac electric discharge is: advantageously required oscillation and amplification of applied voltage can be easily attained because of its low frequency, and the load matching can be easily attained, too. Particularly electric discharging power supplies of commercial frequency (50 or 60 Hz) can be composed of transformers only, and therefore, power supplies of increased capacity can be easily built up.

Disadvantageously plasma parameters, however, are liable to vary with the frequency of power supply, and accidental adhesion of undesired dielectric substance to the electrode surface causes disappearance of electric discharge. Electric discharge cannot appear easily at a relatively low gas pressure, as is the case with the dc electric discharge.

The common feature both of high-frequency, static-electricity coupling electric discharge and high-frequency, inductive magnetic coupling electric discharge is: electric discharge cannot be adversely influenced by undesired dielectric substance even if accidentally adhered to the electrode surface, and the electric discharge remains stable. Electric discharge can be initiated even at a relatively low gas pressure.

Disadvantageously plasma parameters, however, are liable to vary with the frequency of power supply. Required oscillation-and-amplification and the load matching cost much because of the high frequency used, and plasma cannot be evenly expanded in a relatively large space without difficulty.

The feature of microwave electric discharge is: it uses such a high frequency that no electrode may be required; plasma parameters are almost stable with time as is the case of dc electric discharge; and electric discahrge can be produced with ease at a relatively low gas pressure. Disadvantageously use of extremely high frequency requires much cost involved for oscillation, amplification, power transmission, load matching and other equipment matters; and the even expansion of plasma in a relatively large space cannot be attained with ease.

In case of ac electric discharge and high-frequency electric discharge both using electrodes the voltage applied between two electrodes will vary sinusoidally, and therefore, the applied voltage will be zero once for each period, and therefore, the electric discharge will be interrupted once for each period. Therefore, if a plasma resulting from such an electric discharge has a life shorter than the period of alternating voltage, the plasma varies largely with the frequency of applied voltage.

As may be realized from the above, the structure of power supply can be simplified as the frequency used is reduced. Use of ac or dc power supplies permits an increased amount of electric discharge to appear easily at a relatively low cost, but electric discharges are liable to disappear in the presence of undesired dielectric substance accidentally adhered to the electrode surface or in the atmosphere of relatively low pressure. In case of ac power supplies plasma parameters are changeable.

Power supplies of increased frequency are free of such defects, but very expensive and not satisfactory in producing electric discharge in a relatively large space.

One object of the present invention is to provide a new ac electric discharging power supply using a plurality of phase-controlled power supply units and associated electrodes to produce electric discharge of relatively low frequency including commercial frequencies, which electric discharge is equivalent to the one produced at high frequencies, not being influenced adversely by undesired dielectric substance accidentally adhered to the electrode surface or by lowering the gas pressure, still assuring that plasma parameters are almost stable with time.

The power supply uses such a low frequency that a large amount of electric discharge may be permitted at a relatively low cost, and this feature is very advantageous to reduction of the invention to practice.

SUMMARY OF THE INVENTION

A multi-electrode type of electric discharging power supply according to the present invention is characterized in that it comprises:

- electric power dividing means for dividing ac power of low frequency into a plurality of divisional power quantities;
- a plurality of discharging electrodes arranged in the divisional discharging vessel, a common return were associated therewith being at a floating potential; and
- power feeding order setting means for setting the order in which the discharging electrodes are fed with the divisional power quantities; and phase controlling means for controlling the divisional power quantities in phase so as to cause later-electrode plasmas to be continued; whereby a high-density plasma is produced continuously in the space delimited by the surrounding electrodes.

The electric discharging power supply can supply two or more electrodes with phase-controlled power in the order set as desired.

Then, potential difference appears between selected electrodes, thereby causing electric discharges to appear therebetween. Such electric discharges are present all the time without intermission on the whole.

BRIEF DESCRIPTION OF DRAWINGS

FIGS. 16a and 16b show the electrode structure of a coaxial, cylindrical type of ozonizer;

FIG. 17 shows how voltages applied to divisional electrodes vary with time;

FIG. 18 shows how currents flowing in divisional electrodes vary with time;

FIG. 19 shows an equation representing the summation of electric currents flowing in the outer cylindrical electrode;

DESCRIPTION OF THE PREFERRED EMBODIMENTS

Some preferred embodiments of the present invention are decribed below with reference to the drawings.

Figure 1:
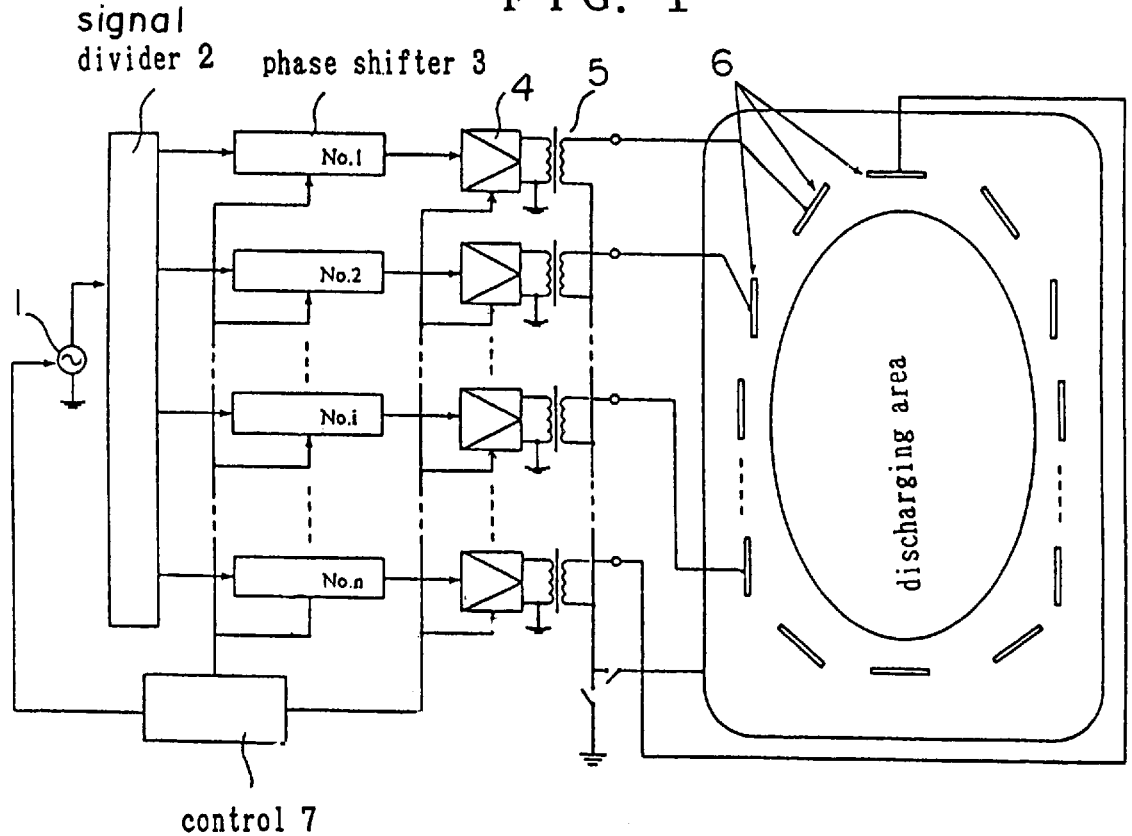
FIG. 1 illustrates the structure of a multi-electrode type of electric discharging power supply according to the present invention.

Referring particularly to FIG. 1, a phase-controlled, multi-electrode type of ac electric discharging power supply according to one embodiment of the present invention is constructed as follows: a master oscillator 1 providing a low-frequency signal at its output terminals is connected to a power division unit 2, which is, in turn, connected to a plurality of phase-shift units 3; each phase-shift unit 3 is connected to each of the electrodes 6 of an electric discharging vessel via an associated low frequency power amplifier 4 and tranformer 5; and a control 7 is connected to the master oscillator 1, the phase-shift units 3 and the power amplifiers 4 to control these members.

In operation of the so constructed power supply the signal from the master oscillator 1 is divided into a plurality of divisional signals by the power division unit 2, and each divisional signal is controlled in phase and amplitude by the associated phase-shift unit 3 and power amplifier 4. The oscillation frequency, phases and amplitudes are controlled coordinately by the control 7, and the final outputs are directed from the transformers 5 to the electrodes 6 respectively.

The transformers 5 each have one output terminal connected in common, ordinarily in floating condition, and electric discharges are allowed to appear between selected electrodes 6.

The common connection, however, can be connected to the ground or to the vessel when occasions demand. Then, electric discharges are allowed to appear between selected electrodes 6 and the vessel wall.

The phases and amplitudes of voltages applied to the electrodes 6 can be controlled to be most appropriate for the purpose, and all phases and amplitudes of voltages can be the same to meet a particular demand. The electrode shape and arrangement can be determined to be most appropriate for particular applications.

Positive electric current will flow in one or more electrodes to which the highest or same voltages are applied, thereby causing one or more electric discharges to appear while negative electric currents flow in the other electrodes. Thus, electric discharging currents in selected electrodes are badly distorted from the sinusoidal waveform, thereby causing significant quantity of harmonic current whose frequency is higher than the applied frequency to flow.

As a result, the electric discharge thus produced is, in fact, equivalent to high-frequency electric discharge, which is less sensitive to undesired adhesion of dielectric substance to electrodes.

In case that a plurality of electrodes are arranged in circle to surround an electric discharging area, one or a small number of electrodes carrying positive electric current will be anodes, and the other electrodes will be cathodes, thus creating an electric discharge like a hollow cathode electric discharge. Thus, electrons will be confined within the negative potential barrier to expedite ionization by electrons. As a result electric discharges can be effectively produced in the atmosphere of relatively low pressure.

Inter-electrode electric discharges appear at any moment of each period, thereby producing plasma continuously without interruption.

Reduction of gas pressure causes expansion of the discharging space around each electrode so that adjacent discharging spaces may be overlapped, and then, the effective electric discharging area is large enough to contain some electrodes.

As the gas pressure is reduced, plasmas appearing around selected electrodes will expand over a sufficient large area before disappearing through recombination. Accordingly the plasma parameters of the resultant plasma in the area delimitted by selected electrodes remain almost unchangeable inspite of electric discharge occuring at a relatively low frequency.

Figure 2:
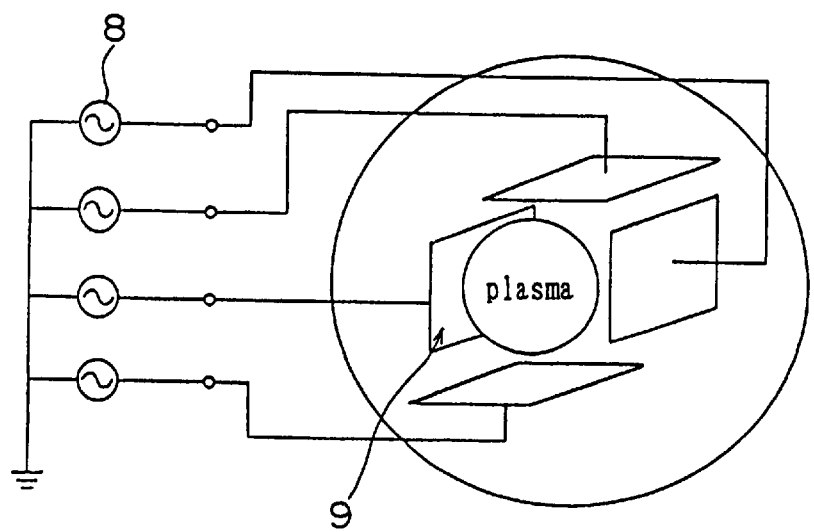
FIG. 2 is a simplified schematic view of the electric discharging power supply.

FIG. 2 shows one simple example of electric discharge power supply, which has four flat plate electrodes 9 parallel and orthogonally arranged in two pairs. Associated ac power supply units 8 supply these four electrodes 9 with four power divisions of the same amplitude, the phases of which power divisions are one fourth of a period apart from each other.

Voltages applied to these electrodes vary in phase in the order numbered (sequentially delayed), thus causing the electrode potential to travel in such direction.

Figure 3:
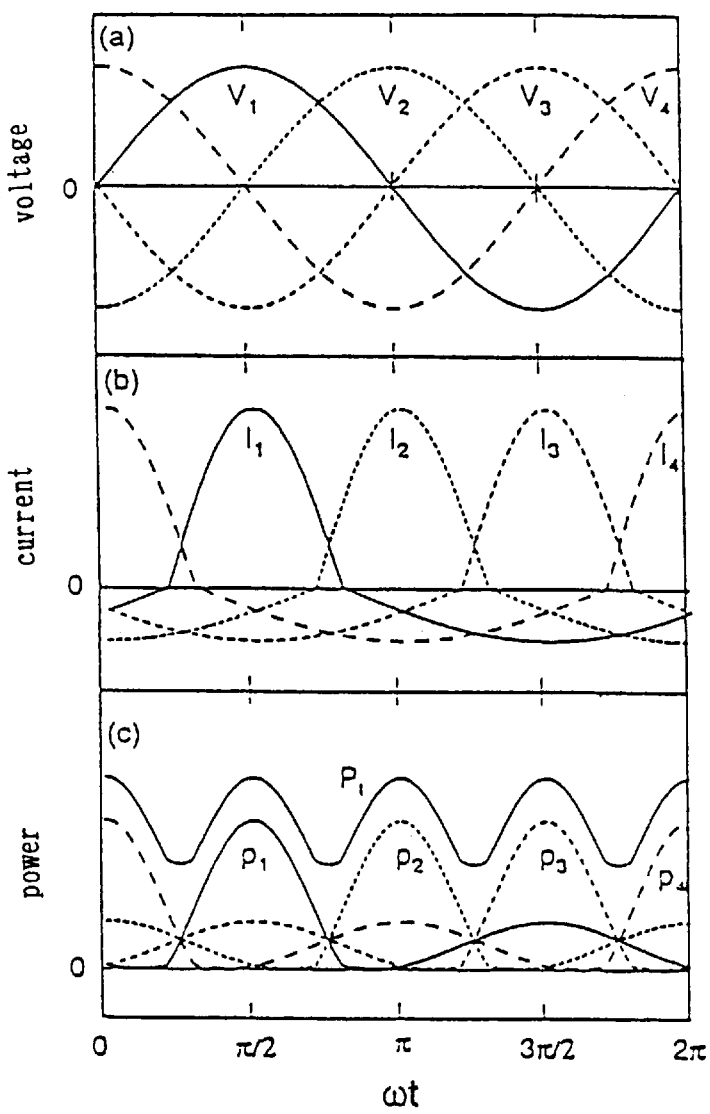
FIG. 3 shows electric discharging characteristics in the electric discharging power supply.

Referring to FIG. 3, the electric discharge characteristics of the electric discharging power supply are described below.

FIG. 3a shows how potential difference (discharging voltage) V between the potential of each of the four electrodes and a given reference potential varies; FIG. 3b shows how discharging current I flowing in each electrode varies; and FIG. 3c shows how instantaneous electric power (voltage x current) P varies, and how the total instantaneous electric power of all electrodes varies.

FIGS. 3a and 3b reveal that: (a) voltages applied to adjacent electrodes are a quarter of one period (90 degrees) apart in phase; (b) electric discharge appears between the anode, that is, the electrode whose potential is highest of all four electrodes at the instant of electric discharging, and each of the cathodes, that is, each of the other electrodes; and (c) the electric discharge is shifted (or rotated) from electrode to electrode in as long a time as the phase delay (90 degrees) while sequential electric discharges are partly overlapped.

FIG. 3c reveals that: (a) the instantaneous electric power on each electrode has a relatively large peak value consistent with the positive discharging current, and a relatively small peak value consistent with the flowing of negative discharging current; (b) it has a frequency double the applied frequency; (c) the degree of variation in the total instantaneous electric power of all electrodes (the amount of variation/medium value) is substantially reduced; and (d) the variable component pulsates at a frequency four times larger than the applied frequency.

Figure 4:
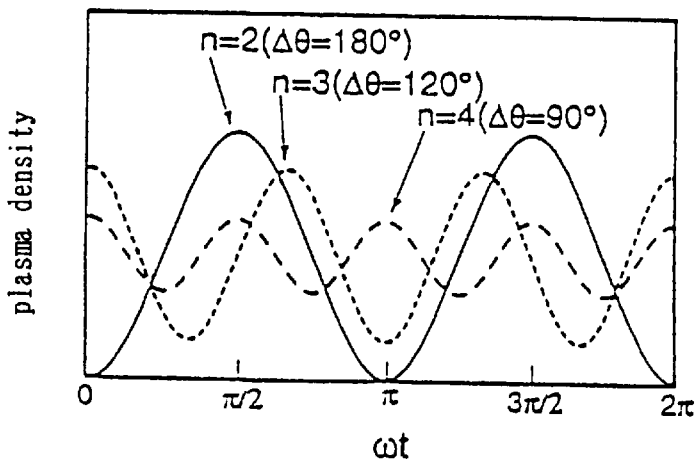
FIG. 4 shows how the plasma density varies for different numbers of phase controlling divisions.

FIG. 4c shows how plasma density varies for different phase distributions given by dividing one period ($2\pi$) by the number of electrodes. Plasma diffusion is almost equal to the inter-electrode distance. An ordinary imbalanced electric discharge (one elctrode being grounded) or a balanced ac electric discharge takes place for n=2 (two electrodes), and the electric discharge in the elctric discharging power supply of FIG. 2 are given for n=4 in FIG. 4.

The density of the plasma produced within the area delimitted by the surrounding electrodes varies with time in the same way as the instantaneous total electric power, and the fluctuation rate will decrease inversely with the increase of phase-controlled electrodes. Thus, in spite of the low-frequency electric discharge the fluctuation of the resultant plasma is as small as the high-frequency electric discharge.

The phase-controlled, multi-electrode type of ac electric discharge power supply works at a relatively low frequency, and therefore, its power supply section is composed of low-frequency components. A personal computer and an associated multi-channel D/A converter permit signals having different periods and waveshapes to be simultaneously produced and simultaneously controlled in phase and amplitude.

Figure 5:
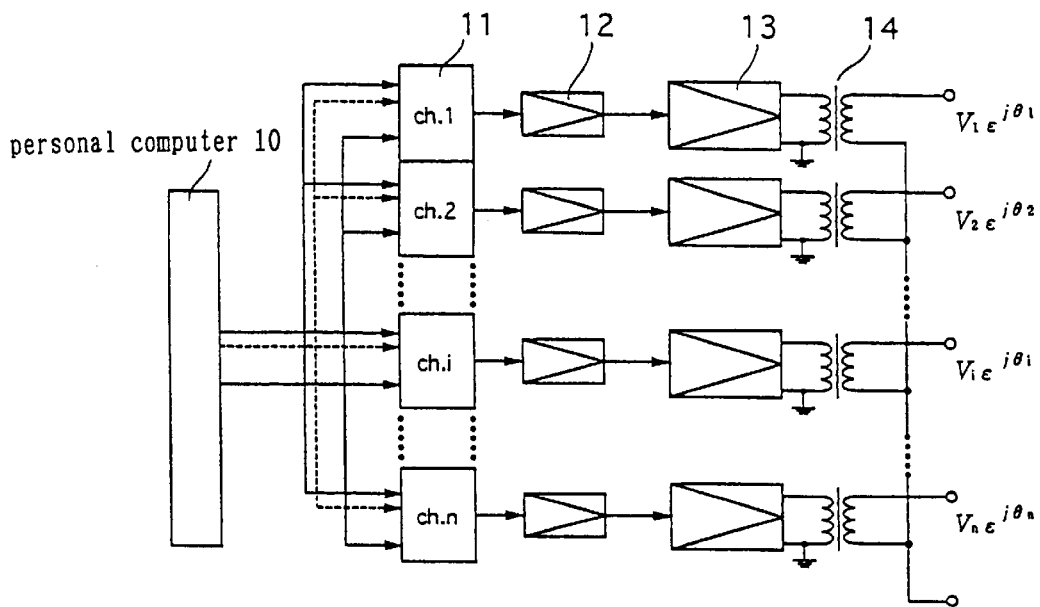
FIG. 5 is a schematic view of an electric discharging power supply using a personal computer and an associated D/A converter.

FIG. 5 shows an electric discharge power supply using a personal computer 10 and a multi-channel D/A converter 11. The electric discharge power supply can work at a low frequency below 1,000 Hz excluding the commercial frequency (50 or 60 Hz). In the electric discharge power supply the personal computer 10 is connected to the multi-channel D/A converter 11 via a digital bus line through the agency of associated photo-isolation interfaces, thus preventing any interference between the control section and the power supply section.

A buffer amplifier 12 is connected to each channel of the multi-channel D/A converter 11, and a low-frequency electric power amplifier 13 follows each buffer amplifier 12.

An output transformer 14 follows each of the power amplifiers 13 for the purpose of making the associated electrode float from the ground in the sense of direct current.

In the so constructed electric discharge power supply the personal computer 10 provides phase-controlled digital signals, and the multi-channel D/A converter 11 converts such phase-controlled digital signals to ac analogue signals, which are outputted in channels 1 to —n.

Then, the buffer amplifiers 12 function to prevent any interference between the signal-generating side and the signal-feeding side, and the ac analogue signals are amplified by the power amplifiers 13 to provide electric power large enough to cause electric discharges to appear on the electrodes.

The output transformers 14 function to isolate the common return path between the output impedance of the power supply and the load impedance electric discharging side from the ground potential common return path on the electric discharging side from the ground, which common return path, however, can be grounded when occasions demand.

Again referring to FIG. 1, the master oscillator 1 can have signals of zero frequency, that is, dc signals appearing at its output terminal.

In this particular case the dc signal is directed to associated switching devices which are capable of controlling signals in phase by on-and-off switching action, and the discharging voltage pulses thus produced are directed to the electrodes via associated pulse power amplifiers.

Figure 6:
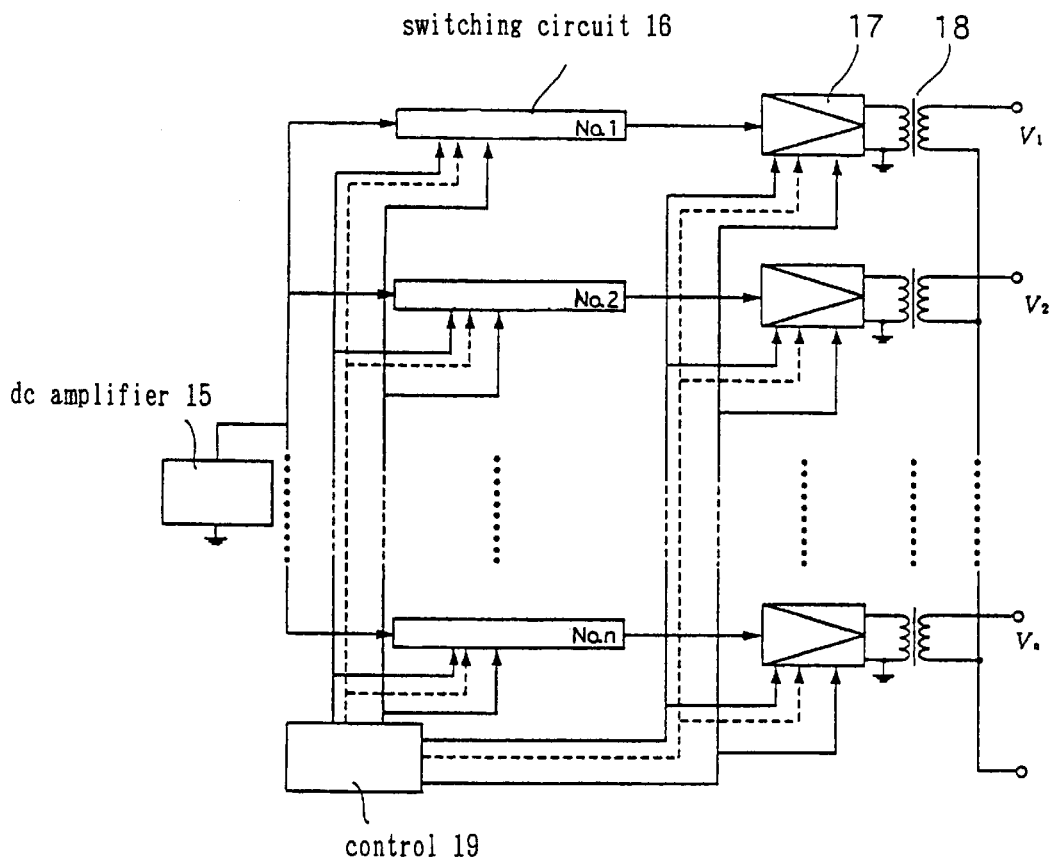
FIG. 6 is a schematic view of an electric discharging power supply using a plurality of switching circuits.

FIG. 6 shows an electric discharge power supply using a plurality of switching circuits to provide a set of phase-controlled discharging voltage pulses.

As shown, a plurality of high voltage resistant switching circuits 16 are connected to a dc power supply 15, and each of the switching circuits 16 is connected to a pulse power amplifier 17, which is, in turn, connected to a pulse transformer 18.

The switching circuits 16 and pulse power amplifiers 17 are connected to a control 19.

The manner in which the multi-output ac power supply is phase-controlled, and the manner in which a plurality of electrodes are energized can be so determined as to meet particular demands.

Assuming that the power supply is applied to sputtering-and-coating, the electric powers to supply to the electrodes may be equal in phase or amplitude, or may be changed so as to be most appropriate for the sputtering-and-coating.

In the so constructed electric discharge power supply the dc voltage appearing at the output terminal of the dc power supply 15 is converted into low-frequency rectangular waveforms by the switching circuits 16, and then these rectangular voltages are amplified by the pulse power amplifiers 17.

The control 19 attains a required coordinate control of oscillation frequency, phase and amplitude.

The voltages appearing at the output terminals of the switching circuits 16 are directed to the divisional electrodes via the pulse power amplifiers 17 and pulse transformers 18.

Figure 7:
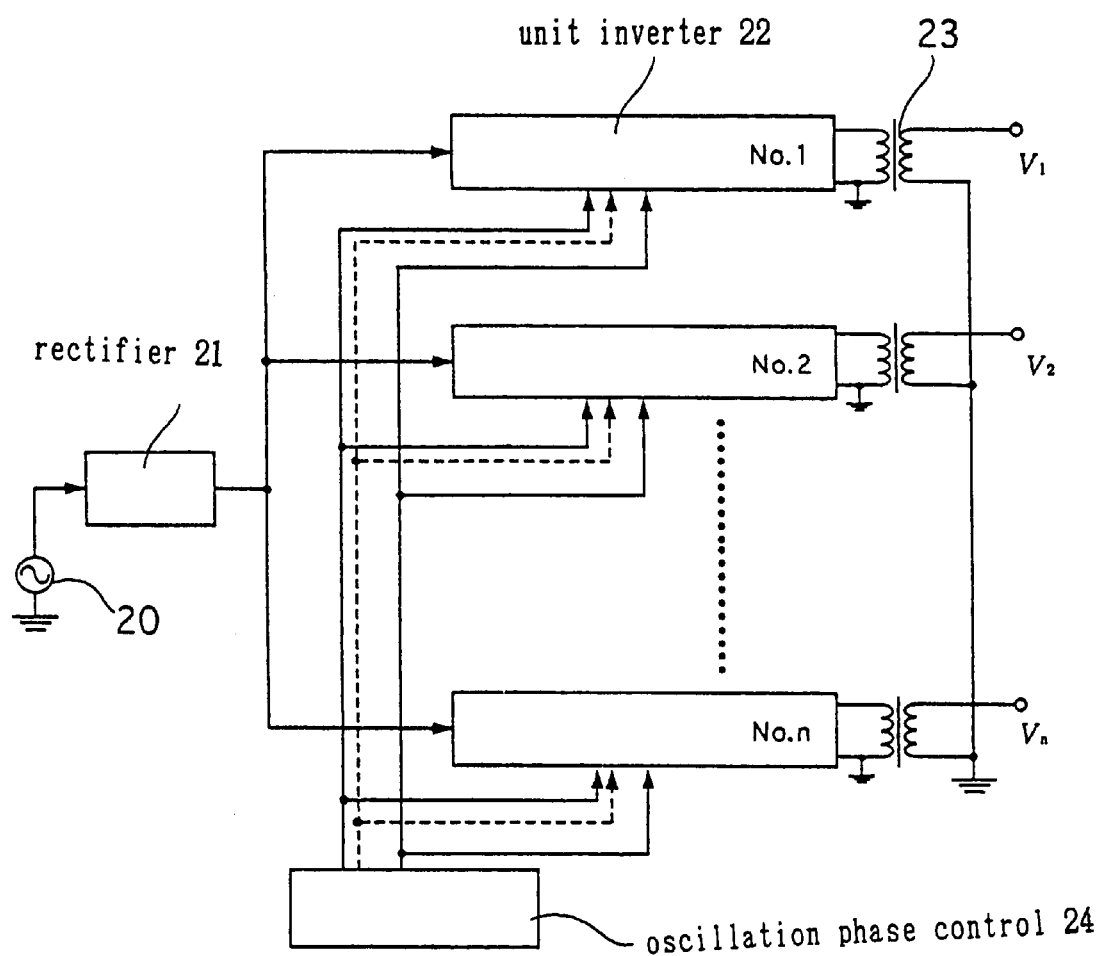
FIG. 7 is a schematic view of an electric discharging power supply using a plurality of inverters.

FIG. 7 shows another example of electric discharging power supply using a plurality of inverters to provide a set of phase-controlled voltage pulses.

As shown, a plurality of unit inverters 22 each comprising a power transistor or a gate-turnoff thyristor are connected to a single or three-phase ac voltage source 20 via a rectifier 21, and each of the unit inverters 22 is connected to a low-frequency transformer 23. The unit inverters 22 are connected to an oscillation phase control 24.

The common return path on the output side of each low-frequency transformer 23 is grounded, but it may be put in floating condition when occasions demand.

In the so constructed electric discharge power supply the single or three-phase ac voltage appearing at the output terminal of the ac voltage source 20 is converted into dc voltage by the rectifier 21, and then the dc voltage is converted to low-frequency, rectified waveforms by the unit inverters 22. Then, the oscillation phase control 24 directs control signals to the unit inverters 22 for effecting required control in frequency and phase.

The unit inverters 22 feed output voltages to the divisional electrodes via the low-frequency transformers 23.

Figure 8:
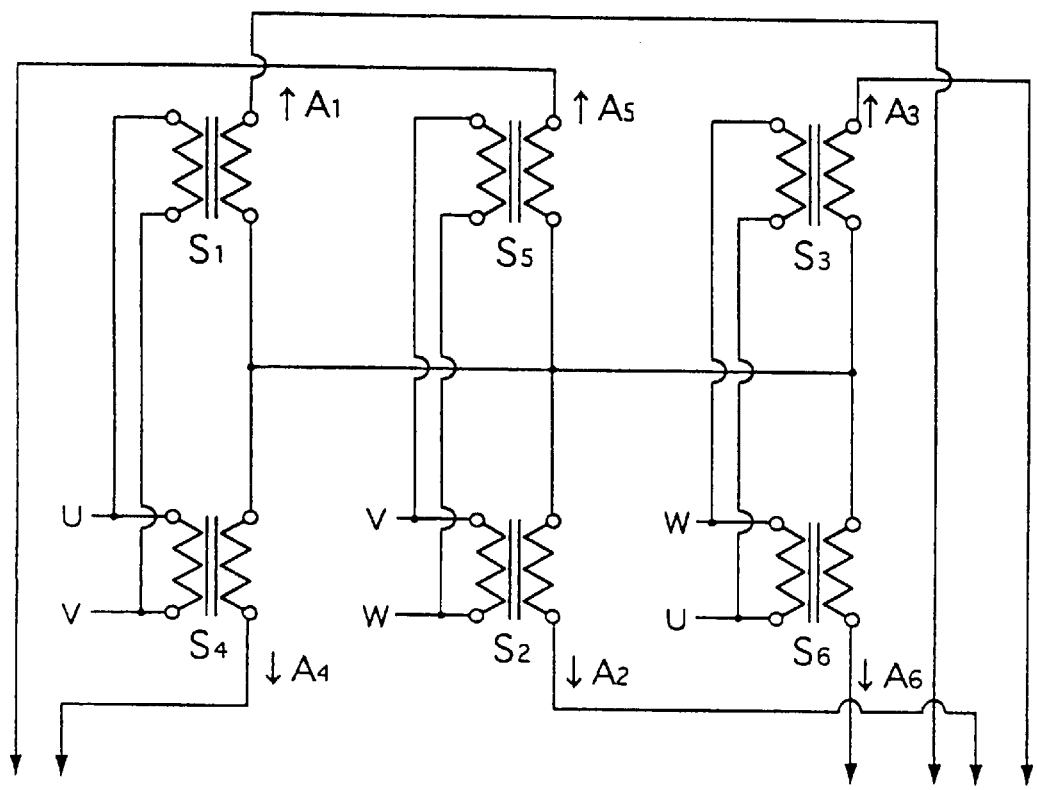
FIG. 8 is a schematic view of an electric discharging power supply using a six-phase alternating current.

An electric discharging power supply may use a three-phase ac power supply and a plurality of commercial power transformers to provide phase-controlled voltages. FIG. 8 shows such an electric discharging power supply which is designed for three-phase ac voltage to be inputted and for six-phase ac voltage to be outputted.

In the electric discharging power supply the phase-controlling is evenly effected, and the value is fixed by the wiring of transformers.

As shown, the electric discharging power supply uses three sets of paired transforners, $S_1$—$S_4$, $S_5$—$S_2$ and $S_3$—$S_6$. The primary coils of each pair of transformers are parallel-connected to provide the ac input terminals U-V, V-W and W-U, and the secondary coils of each pair of transformers are series-connected to feed the electrodes with single-phase output voltages $A_1$ and $A_4$; $A_5$ and $A_2$; and $A_3$ and $A_6$, which are opposite in phase.

The single-phase ac voltages $A_1$, $A_5$ and $A_3$ appearing at the output terminals of the transformers $S_1$, $S_5$ and $S_3$ are 120 degrees out of phase from the single-phase ac voltages $A_4$, $A_2$ and $A_6$ appearing at the output terminals of the transformers $S_4$, $S_2$ and $S_6$.

The single-phase ac voltages $A_1$ to $A_6$ are related in phase as decribed above, and the electric discharge power supply provides single-phase voltages whose phases are 60 degrees apart from each other.

These single-phase ac voltages $A_1$ to $A_6$ are fed to the electrodes in the order of subsequent phases as follows.

Assume that the single phase ac voltage $A_1$ is applied to a selected electrode, and then the single phase ac voltage $A_2$ whose phase is 60 degrees behind is applied to the next electrode clockwise (or counterclockwise) adjacent to the first electrode, and so on. Specifically sequential single phase ac voltages $A_3$, $A_4$, $A_5$ and $A_6$ are applied to subsequent electrodes.

Thus, a plurality of electric discharges appear in the area delimited by the surrounding electrodes all the time, and these electric discharges are aligned in direction, rotating continuously as a whole.

In a conventional single-phase electric discharge power supply the direction in which electrons and ions are accelerated changes 180 degrees instantly every time the voltage reverses its direction. Contrary to this, the accelerating direction changes continuously, thereby accelerating electrons and ions continuously. Stated otherwise, the electric discharge appearing between a selected pair of electrodes can be retained without interruption.

Thus, the energies of electrons and ions can be raised effectively to produce high-density plasma in the electric discharge power supply, and therefore, plasma can be retained even at a reduced pressure, compared with the conventional electric discharging power supply.

The electric discharge appearing between a selected pair of electrodes makes one revolution per period. Thus, a plurality of electric discharges aligned in direction make 50 or 60 revolutions per second all together.

To attain this one output terminal of each transformer 5 is connected in common, ordinarily remaining at floating potential (see FIG. 1), thereby permitting electric discharges to appear only between electrodes 6.

The electric discharging arear turns from electrode to electrode during one period, permitting electric current to flow continuously without intermission.

This continuity of electric current cannot be realized in single-phase or two-phase ac electric discharges or ordinary high-frequency electric discharges: in which the electric current becomes zero once for each period.

The potential at the neutral point is biased deeply on negative side.

The potential of the plasma appearing between electrodes 6 in a surface-treatment apparatus is found to be almost equal to the ground potential, and therefore, the potential at each electrode is of negative value relative to the plasma potential all the time, excluding a length of time for which the electric discharge stands on the electrode.

The dc bias is caused by the rectifying function of the plasma, which is produced by electric discharges.

Specifically when the electrodes 6 immersed in the plasma have a potential higher than the plasma potential, large current of electrons flow in the electrodes whereas when electrodes 6 have a potential lower than the plasma potential, small current of electrons flow in the electrodes.

As the neutral point of the surface treatment apparatus is not connected to the ground, the electrodes 6 in the plasma are at a floating potential in the sense of direct current.

Therefore, when the potential of each electrode is varying in value and reversing its direction, no net value of direct current flows in each electrode.

As a result a negative dc (self-) bias is automatically caused at each electrode so that the average value of electrons and ions flowing into the electrode for the positive half-period may be equal to the average value of electrons and ions flowing into the electrode for the negative half-period.

This large negative self-bias has the effect of applying strong pull to ions to the electrode, thereby causing the sputtering by the ion bombardment on the electrode surface. Thus, each electrode functions as a sputtering target.

In case of phase-controlled, multi-electrode electric discharging the electric discharging area is shifted from electrode to electrode during one period, thus permitting the sequential use of electrodes 6 as sputtering target.

Thus, sputtered particles fall toward the center from the surrounding electrodes so that an object placed at the center may be evenly coated.

The surface treatment apparatus can be designed so as to have electrodes arranged in such a formation that the sputtering-and-coating may be most effectively performed.

Particular electrode formations may be determined to meet demands in different applications. Ordinary electrode formations are described hereinafter.

Figure 9:
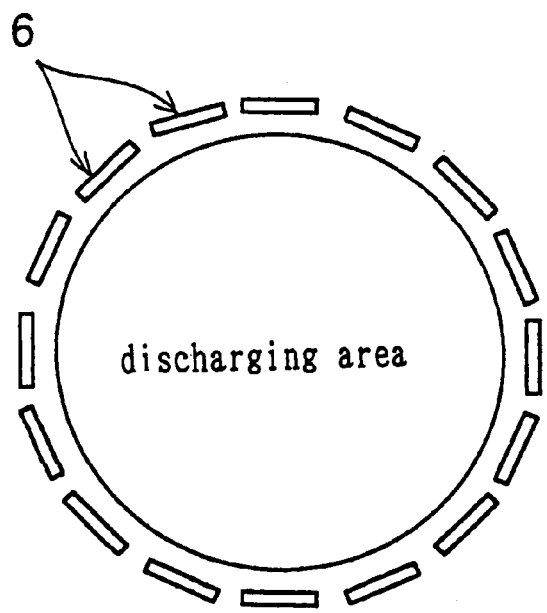
FIG. 9 is a schematic view of electrodes arranged in circle.
Figure 10:
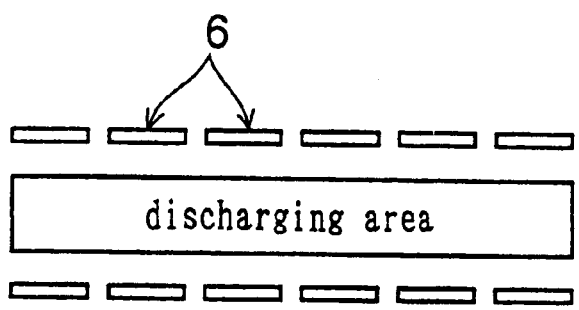
FIG. 10 is a schematic view of electrodes parallel-arranged in line.

FIGS. 9 and 10 show examples of ordinary electrode formations. Specifically FIG. 9 shows a circular arrangement of flat electrodes 6 whereas FIG. 10 shows a linear, parallel arrangement of flat electrodes 6.

The surface-treatment apparatus can work on not only a stationary object to be coated but also a moving object such as thread-like or belt-like object, which is fed continuously to the coating spot.

Figure 11:
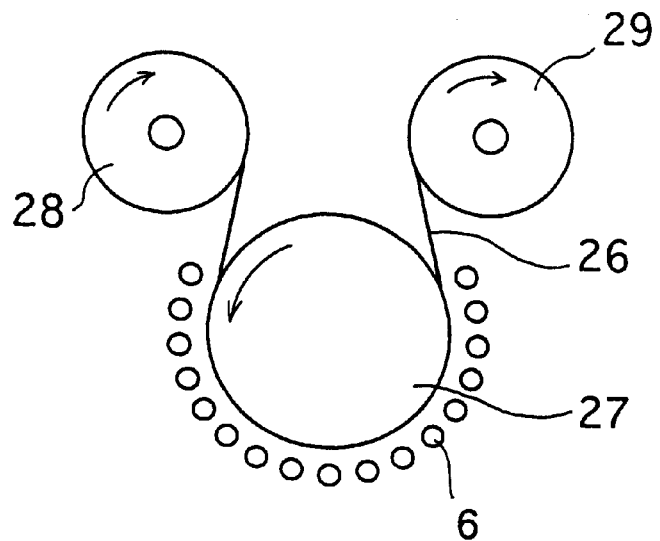
FIG. 11 is a schematic view of an electric discharging power supply having electrodes arranged around a cooling cylindrical roll.
Figure 12:
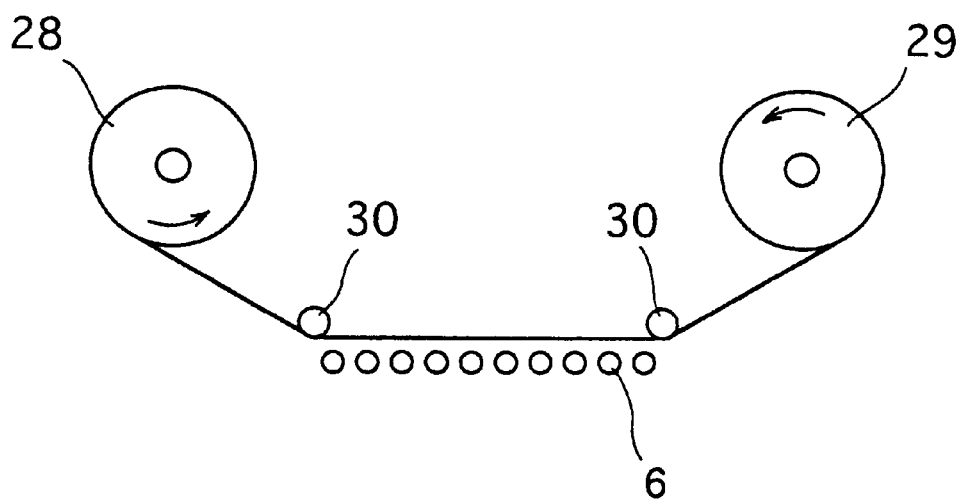
FIG. 12 is a schematic view of an electric discharging power supply having electrodes arranged in line.

FIGS. 11 and 12 illustrate electrode arrangements of electric discharging power supplies, which are applied to the coating of belt-like objects continuously fed.

Referring to FIG. 11, the electric discharging power supply has electrodes 6 arranged around a cylindrical cooling roll 27. A belt-like object 26 is unwinded from a feeding roll 28, and is wound around a winding roll 29 by rotating the winding roll 29. The belt-like object 26 runs on the cylindrical cooling roll 27 under the circular arrangement of electrodes 6.

Referring to FIG. 12, the electric discharging power supply has electrodes 6 arranged straight between opposite guide rolls 30. A belt-like object 26 is unwinded from a feeding roll 28, and is wound around a winding roll 29 by rotating the winding roll 29. The belt-like object 26 runs under the linear arrangement of electrodes 6.

These electric discharging power supplies may use electrodes of different materials to form a composite coating on an object by selectively energizing such different electrodes, thereby forming a lamination of different coatings on the object.

Figure 13:
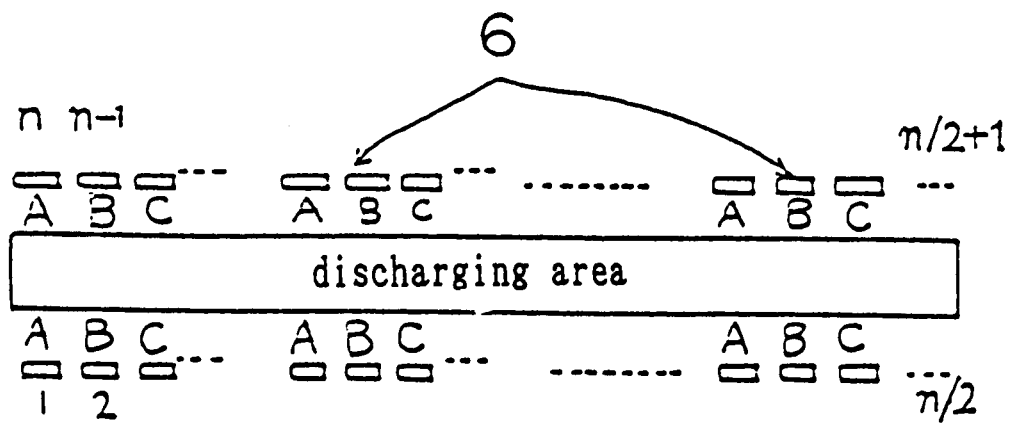
FIG. 13 is a schematic view of parallel arrangement of electrodes of different materials.

FIG. 13 shows "n" sets of electrodes each composed of electrodes 6 of "m" different materials, and the electric power supply is so phase-controlled that all of these electrode sets may be energized sequentially during one period.

Alternatively each set may be composed of same materials, but the electrodes of each set may be different from any other set in material.

The on-and-off control is effected in time division: a phase-controlled voltage is applied to the electrodes of material "A" when these electrodes are put in the "on" condition, and so on. Thus, the voltage is fed like a travelling waveform in one direction.

When the electrodes UA are put in the "on" condition, the other electrodes UB, UC—are put in the "off" condition, and at the same time, these electrodes of materials "B", "C"— are negative-biased to prevent deposition of material A thereon.

Dependence of discharging current on gas pressure varies with the number of division in phase.

Specifically the discharging current decreases with the decrease of gas pressure, and it increases with the increase of the number of division in phase.

As for a low-frequency electric discharge at 100 Hz, for example, for gas pressure ranging from 0.02 to 0.14 Torr: the discharging current varies 3 to 140 mA with the $2\pi$ divided by two representing one complete cycle (phase difference being 180 degrees); the discharging current varies 4 to 150 mA with the $2\pi$ divided by three representing one complete cycle (phase difference being 120 degrees); the discharging current varies 10 to 170 mA with the $2\pi$ divided by six representing one complete cycle (phase difference being 60 degrees); and the discharging current varies 40 to 200 mA with the $2\pi$ divided by twelve representing one complete cycle (phase difference being 30 degrees).

A remarkable increasing rate of electric current is realized in the low-pressure range, permitting electric discharge to appear at as low pressure as 0.002 Torr.

Expanding of electric discharging limit to such a reduced pressure is advantageous to the sputtering-and-coating application; in case of low-pressure gas the particles sputtered from the target can reach the object to be coated without collision with surrounding gas particles on the way to the target, thereby permitting sputtered particles to hold an increased energy when reaching the object.

In order to form a high-density coating strongly sticked onto a relatively large object it is important to carry out the sputtering process at a relatively low pressure lest their kinetic energy should be lost.

In an attempt to attain this a permanent magnet is attached to the rear side of each electrode to improve the electron impinging-and-ionizing efficiency to the extent that the magnetron sputtering process may be carried out at a relatively low pressure in phase-controlled, multi-electrode type of ac electric dischargeing.

Figure 14:
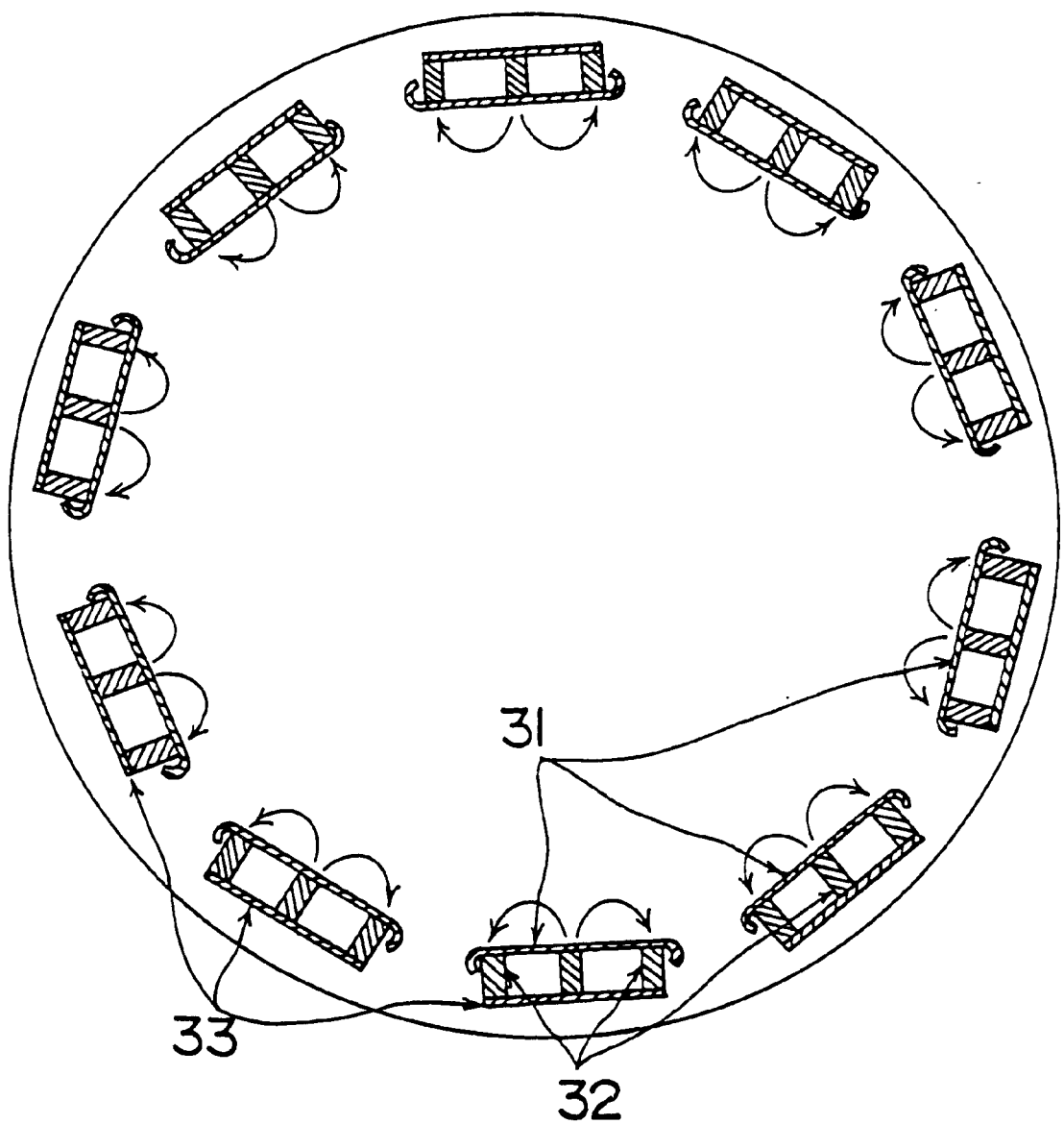
FIG. 14 is a schematic view of a magnetron sputtering device.
Figure 15:
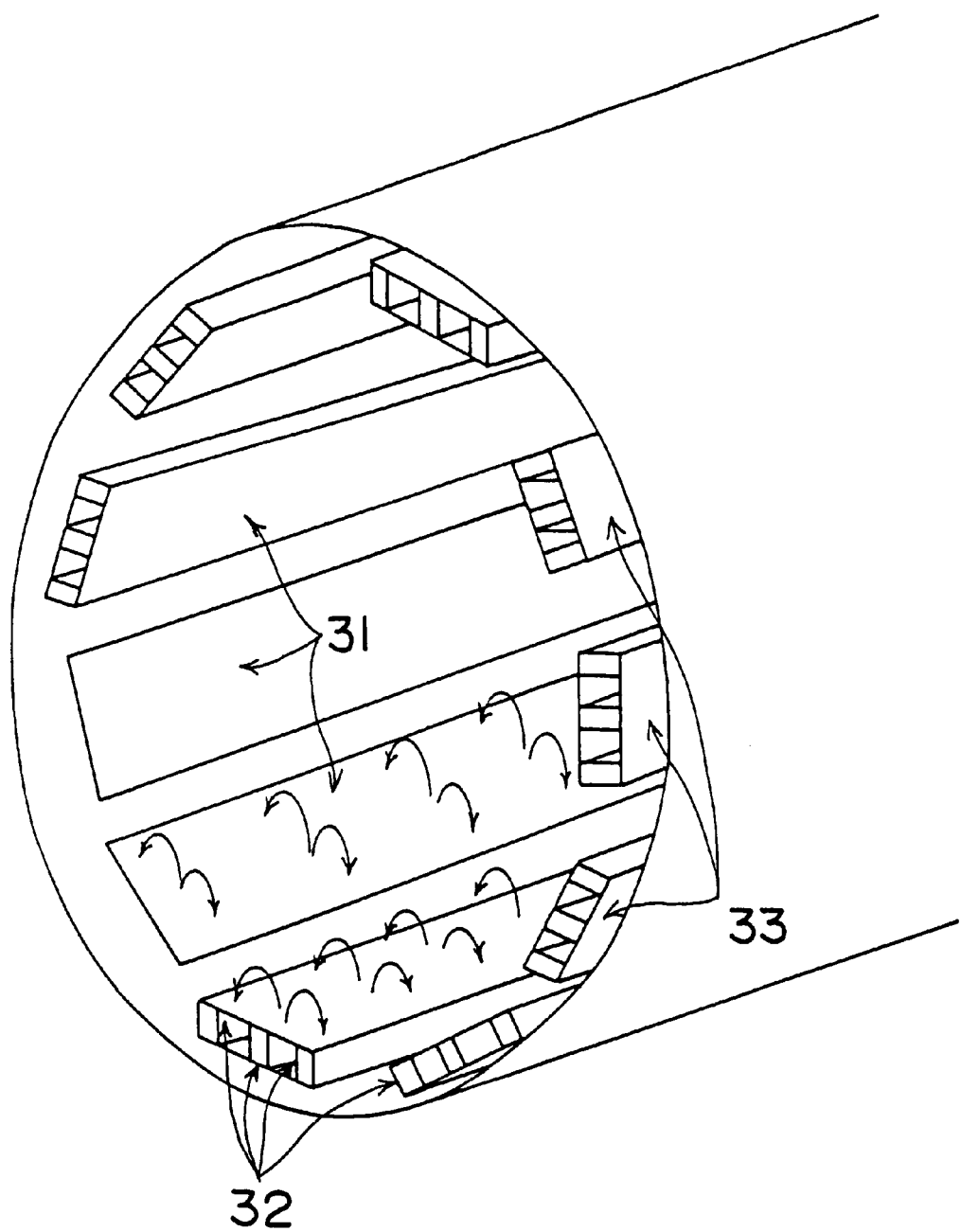
FIG. 15 is a perspective view of the magnetron sputtering device.

FIG. 14 is a front view of a magnetron sputtering apparatus, and FIG. 15 is a perspective view of the magnetron sputtering apparatus.

As shown, a plurality of flat electrodes 31 are arranged in circle. Each electrode has a permanent magnet 32 attached to its rear side, and each permanent magnet 32, in turn, has a magnetic shield 33 attached to its rear side.

As the electric field appearing around each electrode 31 has a component directed perpendicular to the electrode surface, electrons are carried along toward the electrode surface by electric and magnetic lines of force, as is known as "ExB drift". Thus, magnetron electric discharge is caused effectively on each flat electrode 31.

As is seen from FIG. 14, each electrode 31 has rounded edges to prevent local electric discharge at the electrode corners, although not shown in FIG. 15 for the simplicity of drawing.

As for still another example of application of multi-outputting ac power supply to a coaxial cylinder type of ozonizer electric power is divided into 12 divisions, each divisional power being of same amplitude, but being apart from each other by $\frac{1}{12}$ period to be supplied to each of twelve electrodes.

FIGS. 16($a$) and 16($b$) are side and front views of the electrodes of the coaxial cylinder type of ozonizer, respectively.

As shown in these drawings, a glass tube 34 has twelve electrode coatings 35 deposited on its inside, and a metal tube 36 encircles the glass tube 34 with one milimeter-wide annular space left therebetween, thus functioning as an outer circular electrode.

In operation a gas containing oxygen is supplied to the annular space, and ac high-voltage is supplied to the twelve divisional electrodes 35 in a predetermined order.

Then, pulse electric discharge appears sequentially between the grounded outer circular electrode 36 and the divisional electrodes 35, moving clockwise or counterclockwise in the annular space to produce ozone.

The outer cylindrical electrode 36 is cooled by cooling licuid to prevent thermal deposition of ozone, which otherwise, would be caused by the heat generated by electric discharge.

Every second or third electrode may be fed with electricity so as to prevent the ozone produced by the preceeding electric discharge from being destroyed by the following electric discharge, thereby improving the efficiency with which ozone can be produced.

The ac voltage applied to each divisional electrode for producing ozone is sinusoidal at a commercial frequency (50 Hz or 60 Hz), and a series of applied voltages are 30 degrees apart from each other in phase. The pulse current flowing between a selected divisional electrode 35 and the grounded cylindrical electrode 36 is shifted to the subsequent divisional electrode 35 and the grounded cylindrical electrode 36 after 1.7 or 1.4 milliseconds ($\frac{1}{12}$ period), and this is repeated twelve times, allowing the pulse current to rotate once for one period.

FIGS. 17 and 18 show how voltages applied to the divisional electrodes 35 and visualized electric currents vary with time.

In FIG. 17 positive and negative threshold voltages at which electric discharge starts is indicated by Vth. FIGS. 18(1), 18(2) and 18(3) show the electric currents flowing in the first, second and third divisional electrodes.

The recurrence rate at which pulse current appears is 12 times as large as the frequency of applied voltage, that is, 600 Hz or 720 Hz, and the total current $I_t$ flowing in the grounded outer cylindrical electrode is given by the equation in FIG. 19. Assuming that there appears same electric impedance between each divisional electrode 35 and the outer cylindrical electrode 36, that is, same quantity of capacitance and electric discharge resistance, the total current $I_t$ is zero.

Hitherto, sinusoidal voltages of commercial frequency have been applied to to all divisional electrodes in same phase in a conventional electric discharging power supply, allowing electric discharges to appear $2\Delta t$ for each period.

In the coaxial cylindrical type of ozonizer ac high-voltages which are 30° apart from each other in phase are applied to the twelve electrodes, thus increasing the density of discharging current by twelve, and accordingly increasing the ozone-yielding rate.

Positive and negative electric charges are distributed simultaneously over the surface of the glass tube, and electrons move easily to meet positive electric charges, thereby neutralizing the dielectric tube. The electric charge distribution moves in the direction in which phase-lagging voltage appears from electrode to electrode, thereby expediting the neutralization still more.

This has the effect of suppressing the charging of the dielectric tube surface, which charging causes the electric discharge to disappear, thereby extending the dulation of pulse discharging.

As the dulation of pulse discharging is extended, the dormant interval of pulse discharging is shortened, thus causing electric discharges to appear evenly.

For same amount of power consumption the increasing of discharging current will lead to the decreasing of applied voltage, thus reducing the possibility of destroying the dielectric tube by dielectric breakdown, accordingly extending the life of the dielectric tube.

Now, the manner in which electrodes and associated parts are arranged in the coaxial cylindrical type of ozonizer is described.

In order to increase the capacity of the coaxial cylindrical type of ozonizer electrode structures as described below may be so combined in a single unit as to work in parallel.

Figure 20:
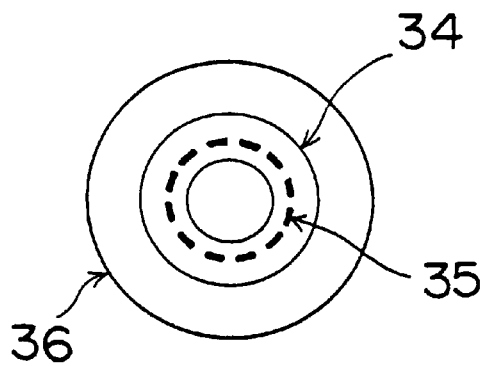
FIGS. 20 to 25 show some examples of electrodes for use in a coaxial, cylindrical type of ozonizer.

Referring to FIG. 20, a plurality of divisional electrodes 35 are embedded in the dielectric annular wall to prevent inter-electrode discharges, which otherwise, would be caused by the potential difference between applied voltages having different phases.

Figure 21:
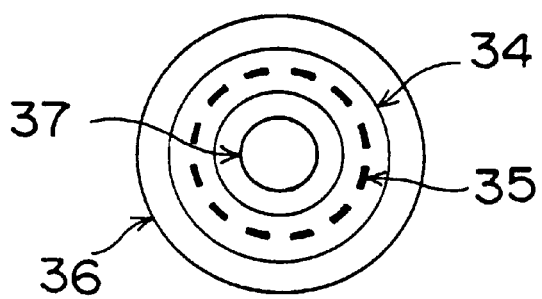

Referring to FIG. 21, a small-sized, high-density ozonizer has a plurality of divisional electrodes 35 embedded in its dielectric annular wall and the ozonizer has inner and outer cylindrical electrodes 37 and 36 to sandwich the dielectric tube therebetween.

An ac high-voltage is applied to a selected divisional electrode 35 to cause electric discharge to appear between the grounded inner electrode 37 and the divisional electrode 35 and between the grounded outer electrode 36 and the divisional electrode 35.

Necessary cooling is effected both on the outside of the outer electrode 36 and the inside of the inner electrode 37.

Figure 22:
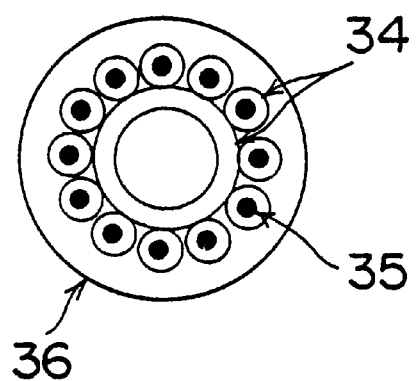

Referring to FIG. 22, each divisional electrode 35 is enclosed by a dielectrid material 34 to provide a slender tube containing an electrode. This slender tube-like shape facilitates the forming and assembling of divisional electrodes.

Figure 23:
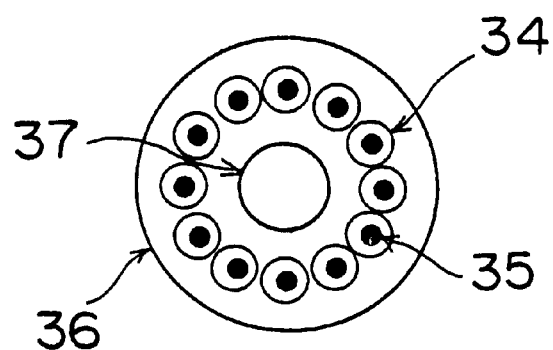

Referring to FIG. 23, circular arrangement of pencil-like divisional electrodes of FIG. 22 are encircled by outer and inner cylindrical electrodes 36 and 37 as is in FIG. 21.

Figure 24:
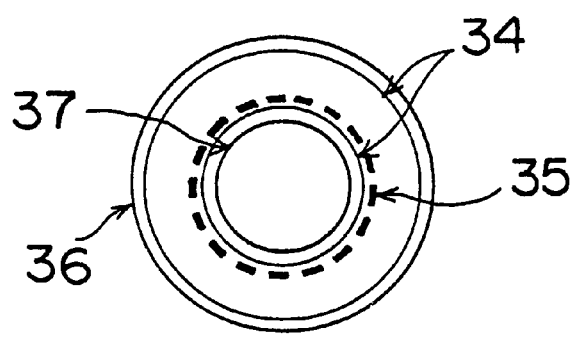

Referring to FIG. 24, the outer cylindrical electrode 36 has a dielectric lining 34 on its inner wall whereas the inner cylindrical electrode 37 has a dielectric covering 34 on its outer wall. Divisional electrodes 35 are arranged on the circumference of the dielectric covering 34 of the inner cylindrical electrode 37. This arrangement is advantageous to superposition of streamer electric discharges on creeping electric discharges. The streamer electric discharge appears between the surface of the dielectric lining 34 of the grounded outer cylindrical electrode 36 and the exposed divisional electrode 35 of high-potential. On the other hand, the creeping electric discharge appears between the dielectric covering 34 of the grounded inner cylindrical electrode 37 and the divisional electrode 35 of high-potential.

Necessary cooling is effected both on the outside of the outer cylindrical electrode 36 and the inside of the inner cylindrical electrode 37.

Figure 25:
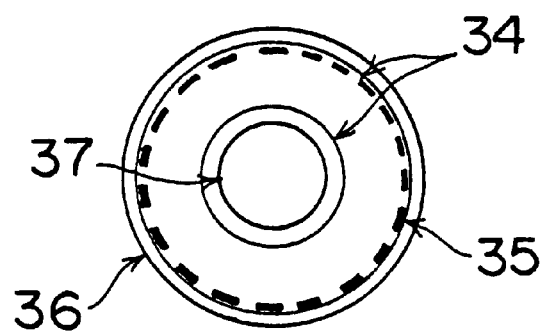

Referring to FIG. 25, divisional electrodes 35 are arranged on the dielectric lining 34 of the outer cylindrical electrode 36 contrary to FIG. 24.

Next, some examples of flat plate type of ozonizers are described with reference to FIG. 26 and subsequent drawings.

Figure 26A:
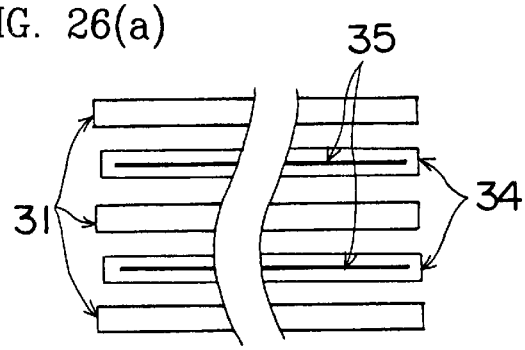
FIGS. 26 to 28 show some examples of electrodes for use in a flat type of ozonizer.
Figure 26B:
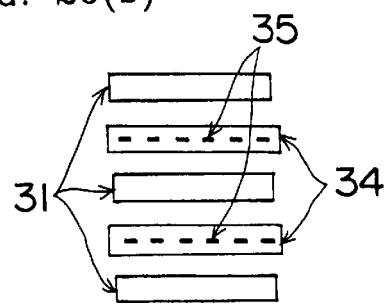

Referring to FIGS. 26(a) and 26(b), a flat plate type of ozonizer has a plurality of divisional electrodes 35 embedded in flat dielectric plates 34.

Each divisional electrode 35 is sandwiched between grounded plate electrodes 31. Electric discharges appear between selected divisional electrode 35 and each of the opposite grounded plate electrodes 31, and necessary cooling is effected on each of the upper and lower grounded plate electrodes 31.

Figure 27A:
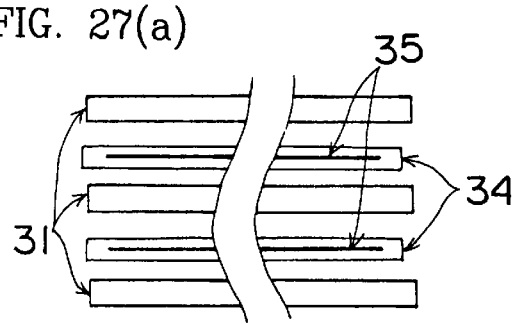
Figure 27B:
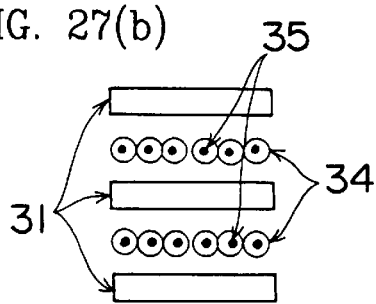

Referring to FIGS. 27(a) and 27(b), a flat plate type of ozonizer uses parallel arrangement of slender cylindrical divisional electrodes 35, each having an electrode enclosed with a dielectric material 34.

Electric discharges appear between selected divisional electrodes 35 and each of the opposite grounded plate electrodes 31, and necessary cooling is effected on each of the upper and lower grounded plate electrodes 31.

Figure 28A:
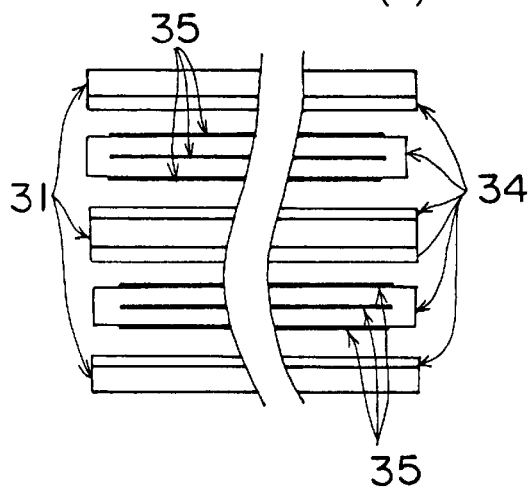
Figure 28B:
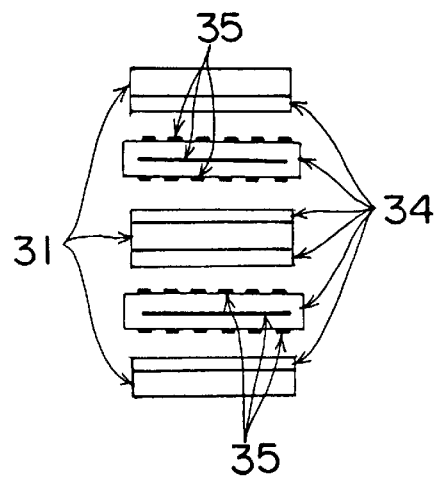

Referring to FIGS. 28(a) and 28(b), a plate-like electrode 31 is covered with a dielectric material 34 on its opposite sides, and a plurality of divisional electrodes 35 are arranged on each side of the dielectric covering 34. This electrode arrangement is advantageous to superposition of streamer electric discharges with creeping discharges around the divisional electrodes. The streamer electric discharges appear between each of the upper and lower grounded plate-like electrodes 31 and selected divisional electrodes of high-potential 35. On the other hand, the creeping electric discharges appear around selected divisional electrodes 35 of high-potential between the overlying dielectric material 34 of the grounded plate-like electrode 31 and the selected divisional electrodes.

Possibility of Industrial Utilization

In case of ac electric discharge the voltage applied to the opposite electrodes varies sinusoidally, crossing zero potential once per period, and then the electric discharge is interrupted. If the life of the plasma caused by such electric discharges is shorter than the period of alternating voltage, the plasma will vary with the frequency of the applied voltage.

As described above, an electric discharging power supply according to the present invention is so constructed that a plurality of divisional electrodes may be supplied with ac voltages of different phases by a plurality of phase-controlled voltage sources, thereby causing electric discharges to appear at some selected divisional electrodes simultaneously.

The electric discharge moves from electrode to electrode in the direction in which phase-lagging voltage is applied sequentially to divisional electrodes, preventing the electric discharge from disappearing as a whole, and making the electric discharge stable.

Even though the electric discharging power supply works at a reduced frequency, the resultant plasma is equivalent to the one produced at an increased frequency, thus permitting electric discharges to appear without difficulty even if undesired dielectric materials should be adhered to electrodes or even if the gas pressure should be reduced. Plasma factors vary hardly with time, and electric discharge of increased power can be provided at a relatively low cost.

We claim:

1. A multi-electrode type of electric discharging power supply characterized in that it comprises:
    electric power dividing means for dividing ac power of low-frequency into a plurality of divisional power quantities;
    a plurality of discharging electrodes arranged in an electric discharging vessel, a common return path associated therewith being at a floating potential;
    power feeding order setting means for setting the order in which the discharging electrodes are fed with the divisional power quantities, and
    phase controlling means for controlling the divisional power quantities in phase so as to cause inter-electrode plasmas to be continued; whereby a high-density plasma is produced continuously in the space delimited by the surrounding electrodes, and
    wherein said electric power dividing means comprises a signal divider converting a single low-frequency signal generator into a plurality of signal sources, and a plurality of low-frequency power amplifiers; said power feeding order setting means comprises a plurality of phase shifters connected to said signal divider; said phase controlling means comprises a control connected to said phase shifters and said low-frequency power amplifiers for controlling said divisional power quantities in phase and amplitude; and transformers are connected between said low-frequency power amplifiers and said discharging electrodes, one output terminals of said transformers being connected in common, thereby providing a floating common return path at a floating potential.

2. A multi-electrode type of electric discharging power supply characterized in that it comprises:
    electric power dividing means for dividing ac power of low-frequency into a plurality of divisional power quantities;
    a plurality of discharging electrodes arranged in an electric discharging vessel, a common return path associated therewith being at a floating potential;
    power feeding order setting means for setting the order in which the discharging electrodes are fed with the divisional power quantities, and
    phase controlling means for controlling the divisional power quantities in phase so as to cause inter-electrode plasmas to be continued; whereby a high-density plasma is produced continuously in the space delimited by the surrounding electrodes, and
    wherein said electric power dividing means comprises a multi-channel D/A converter, a plurality of buffer amplifiers and a plurality of low-frequency power amplifiers; said power feeding order setting means comprises the phase-controlling part of a personal computer connected to the multi-channel D/A converter on its inputting side; said phase controlling means comprises the part of said personal computer for controlling the frequency, waveform, phase and amplitude of said divisional power quantities; and transformers are connected between said low-frequency power amplifiers and said discharging electrodes, one output terminals of said transformers being connected in common, thereby providing a floating common return path at a floating potential.

3. A multi-electrode type of electric discharging power supply characterized in that it comprises:
    electric power dividing means for dividing ac power of low-frequency into a plurality of divisional power quantities;
    a plurality of discharging electrodes arranged in an electric discharging vessel, a common return path associated therewith being at a floating potential;
    power feeding order setting means for setting the order in which the discharging electrodes are fed with the divisional power quantities, and
    phase controlling means for controlling the divisional power quantities in phase so as to cause inter-electrode plasmas to be continued; whereby a high-density plasma is produced continuously in the space delimited by the surrounding electrodes, and
    wherein said electric power dividing means comprises a plurality of switching circuits and a plurality of pulse power amplifiers; said power feeding order setting means comprises a dc power supply connected to said switching circuits in common; said phase controlling means is composed of a control connected to said switching circuits and said pulse power amplifiers for controlling the phases and amplitudes of said divisional power quantities; and pulse transformers are connected between said pulse power amplifiers and said discharging electrodes, thereby providing a floating common return path at a floating potential.

4. A multi-electrode type of electric discharging power supply characterized in that it comprises:
    electric power dividing means for dividing ac power of low-frequency into a plurality of divisional power quantities;
    a plurality of discharging electrodes arranged in an electric discharging vessel, a common return path associated therewith being at a floating potential;
    power feeding order setting means for setting the order in which the discharging electrodes are fed with the divisional power quantities, and
    phase controlling means for controlling the divisional power quantities in phase so as to cause inter-electrode plasmas to be continued; whereby a high-density plasma is produced continuously in the space delimited by the surrounding electrodes, and
    wherein said electric power dividing means comprises an ac voltage source of commercial frequency, a rectifier connected to said ac voltage and a plurality of unit inverters connected to said rectifier; said power feeding order setting means and said phase controlling means are composed of an oscillation phase controller, which is connected to said unit inverters for controlling the frequency, phase and amplitude of said divisional power quantities; and pulse transformers are connected between said pulse power amplifiers and said discharging electrodes, thereby providing a floating common return path at a floating potential.

* * * * *